United States Patent
Ichiyama et al.

(10) Patent No.: US 7,541,815 B2
(45) Date of Patent: Jun. 2, 2009

(54) ELECTRONIC DEVICE, TESTING APPARATUS, AND TESTING METHOD

(75) Inventors: Kiyotaka Ichiyama, Tokyo (JP); Masahiro Ishida, Tokyo (JP); Takahiro Yamaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 467 days.

(21) Appl. No.: 11/371,939

(22) Filed: Mar. 10, 2006

(65) Prior Publication Data

US 2007/0210802 A1 Sep. 13, 2007

(51) Int. Cl.
*G01R 31/02* (2006.01)
(52) U.S. Cl. ............... 324/537; 324/763; 324/765; 714/733; 714/734; 257/48; 329/327
(58) Field of Classification Search ............ 324/537, 324/763, 765; 714/733, 734; 257/48
See application file for complete search history.

(56) References Cited

U.S. PATENT DOCUMENTS

| | | | | |
|---|---|---|---|---|
| 3,967,312 A | * | 6/1976 | Sample | 348/641 |
| 4,030,014 A | * | 6/1977 | Chana et al. | 363/24 |
| 4,225,851 A | * | 9/1980 | Reschovsky et al. | 340/870.04 |
| 5,451,956 A | * | 9/1995 | Lochhead | 342/13 |
| 5,572,164 A | * | 11/1996 | Kasperkovitz et al. | 329/315 |
| 6,300,838 B1 | * | 10/2001 | Kelkar | 331/17 |
| 6,721,371 B1 | * | 4/2004 | Barham et al. | 375/316 |
| 2002/0095632 A1 | * | 7/2002 | Veillette | 714/733 |
| 2005/0213689 A1 | * | 9/2005 | Matsuda et al. | 375/324 |
| 2005/0270893 A1 | * | 12/2005 | Lin et al. | 365/233 |
| 2006/0125508 A1 | * | 6/2006 | Glidden et al. | 324/765 |
| 2007/0247181 A1 | * | 10/2007 | Ishida et al. | 324/765 |

FOREIGN PATENT DOCUMENTS

| | | | |
|---|---|---|---|
| JP | 5-87890 | | 4/1993 |
| JP | 6-342042 | | 12/1994 |
| JP | 06342042 A | * | 12/1994 |
| JP | 2004-226191 | | 8/2004 |

OTHER PUBLICATIONS

International Search Report (form PCT/ISA/210).

* cited by examiner

*Primary Examiner*—Timothy J Dole
*Assistant Examiner*—Benjamin M Baldridge
(74) *Attorney, Agent, or Firm*—Sterne, Kessler, Goldstein & Fox P.L.L.C.

(57) ABSTRACT

A testing apparatus tests the performance of an electronic device having an operation circuit for providing a useful output signal. A demodulator configured to provide a phase or frequency demodulated signal related to the output of the operation circuit is packaged with the operation circuit. The gain of the demodulator is controllable from outside the package. The testing apparatus analyses the demodulated signal and controls the gain of the demodulator.

12 Claims, 12 Drawing Sheets

ELECTRONIC DEVICE, TESTING APPARATUS, AND TESTING METHOD

BACKGROUND OF THE INVENTION

1. Field of the Invention

The present invention relates to an electronic device such as a semiconductor device and a testing apparatus and a testing method for testing the electronic device. More specifically, the invention relates to an electronic device that generates a phase-demodulated or frequency-demodulated signal and a testing apparatus and a testing method for testing such electronic device.

2. Related Art

Conventionally, the following two methods have been known as methods for evaluating a signal-under-measurement generated within an electronic device such as an output signal of the electronic device and a signal transmitting among circuits within the electronic device.

The first method is a method of evaluating the signal-under-measurement by taking it out of the electronic device and the second method is a method of evaluating it within the electronic device by using BIST (Built-In Self-Test).

However, if frequency of the signal-under-measurement is high in evaluating the signal-under-measurement by the first method, the signal-under-measurement deteriorates due to LC components and transmission paths of a package of the electronic device. Therefore, there is a case of excessively evaluating modulated components (or a quantity of jitter) of the signal-under-measurement for example in measuring it by this method as compared to the case of measuring it within the electronic device. Therefore, it is unable to accurately measure the signal-under-measurement by this method.

Still more, frequency characteristics of the BIST circuit varies due to fluctuations of semiconductor manufacturing process and to changes of temperature, supplied voltage and the like in evaluating the signal-under-measurement by the second method. The electronic devices also vary among each other. Therefore, it is necessary to measure the frequency characteristics of the BIST circuit and to calibrate it to a standard in order to accurately measure the signal-under-measurement. For example, it is necessary to measure a gain in the BIST circuit as a function of frequency. Therefore, it is difficult to use this method in a mass-production test that requires to test in a short time.

Accordingly, it is an object of the invention to provide an electronic device, a testing apparatus and a testing method, which are capable of solving the above-mentioned problems. This object may be achieved through the combination of features described in independent claims of the invention. Dependent claims thereof specify preferable embodiments of the invention.

SUMMARY OF THE INVENTION

In order to solve the above-mentioned problems, according to a first aspect of the invention, there is provided an electronic device having an operation circuit for outputting an output signal to be tested or evaluated and a demodulator that receives the output signal from the operation circuit to output a demodulation signal in which a phase-modulated component or frequency-modulated component of the output signal is demodulated.

The electronic device may further include an outputting section for outputting the output signal to the outside when the electronic device is actually operated and outputting the demodulation signal to the outside when the electronic device is tested. The electronic device may further include a package section for storing the operation circuit, the demodulator and the outputting section therein and the outputting circuit may output the output signal and the demodulation signal to the outside of the package section.

The demodulator may output the demodulation signal by outputting pulses having a predetermined pulse width corresponding to edges of the output signal. The demodulator may have a delaying section for generating a delay signal of the output signal delayed by delay time corresponding to the predetermined pulse width and a phase detecting section for outputting pulses having a pulse width corresponding to a phase difference between the output signal and the delay signal.

The demodulator may further includes a delaying section for generating a delay signal of the output signal which has been delayed by a predetermined delay time and a mixer for generating the demodulation signal by multiplying the output signal with the delay signal. The electronic device may further include an integrator for integrating the demodulation signal outputted out of the demodulator.

The electronic device may further include an outputting section for selecting either the demodulation signal outputted out of the demodulator or the signal outputted out of the integrator and outputting it to the outside of the electronic device. The electronic device may further include a plurality of operation circuits that generate output signals, respectively, and a switching section for switching the output signal of the plurality of operation circuits to be inputted to the demodulator.

According to a second aspect of the invention, there is provided a testing apparatus for testing an electronic device having an operation circuit for outputting an output signal to be tested or evaluated and a demodulator that receives the output signal from the operation circuit to output a demodulation signal in which a phase-modulated or frequency-modulated component of the output signal is demodulated, having a measuring section for measuring the frequency-modulated component based on the demodulation signal and a judging section for judging whether or not the electronic device is defect-free based on the frequency-modulated component.

The testing apparatus may further include an integrator for integrating the demodulation signal, the measuring section may measure the phase-modulated component based on an output of the integrator and the judging section may judge whether or not the electronic device is defect-free based on the phase-modulated component.

The testing apparatus may further include a gain calculating section for calculating a gain in the demodulator and the measuring section may measure the phase-modulated component based on the demodulation signal and the gain of the demodulator.

According to a third aspect of the invention, there is provided a testing method for testing an electronic device having an operation circuit for outputting an output signal to be tested or evaluated and a demodulator that receives the output signal from the operation circuit to output a demodulation signal in which a phase-modulated or frequency-modulated component of the output signal is demodulated, having a measuring step of measuring the frequency-modulated component based on the demodulation signal and a judging step of judging whether or not the electronic device is defect-free based on the frequency-modulated component.

It is noted that the summary of the invention described above does not necessarily describe all necessary features of the invention. The invention may also be a sub-combination of the features described above.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention. Like item and step numbers refer to like items and steps among the various drawings.

Figure 1:
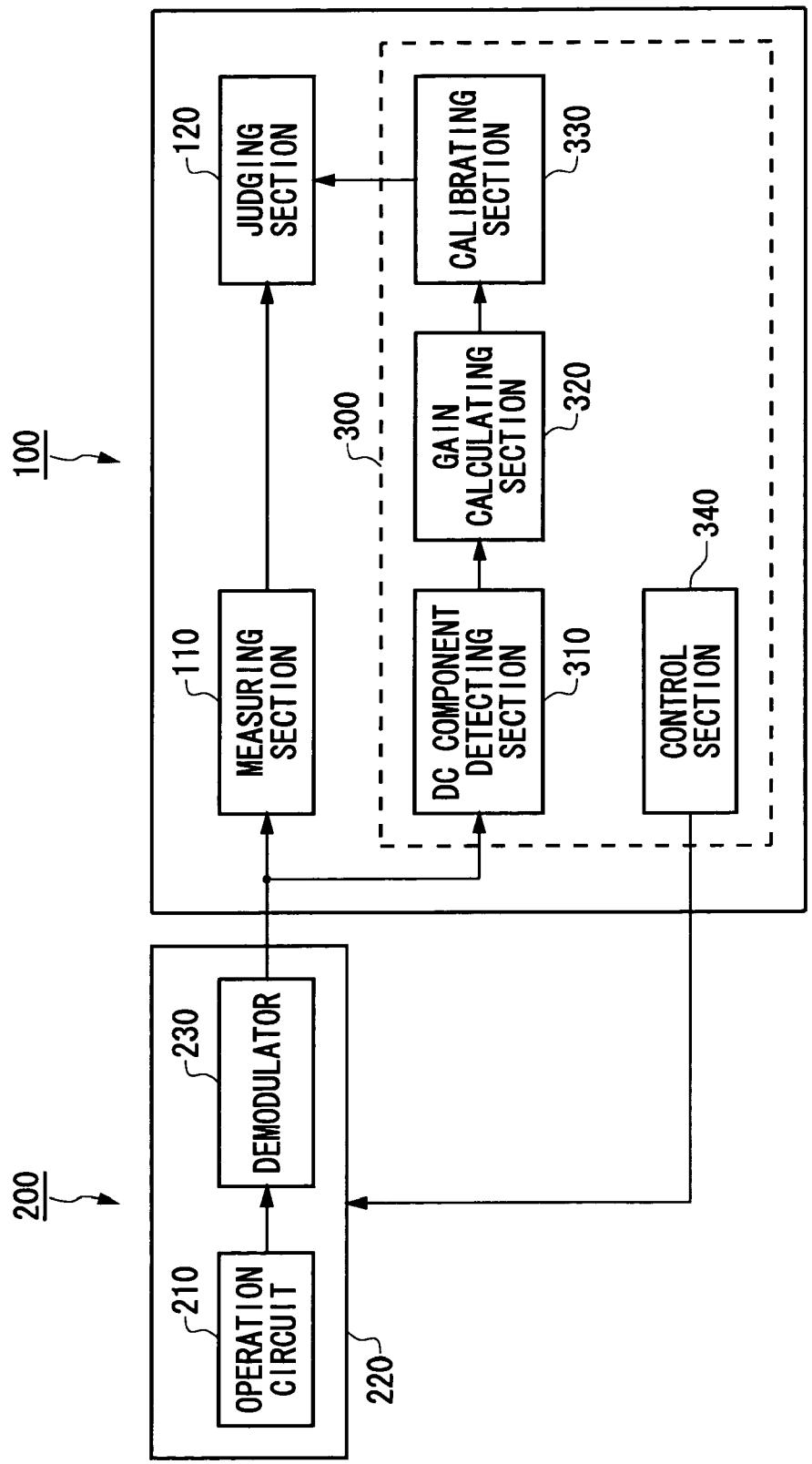
FIG. 1 is a diagram showing one exemplary configuration of a testing apparatus and an electronic device according to one embodiment of the invention.

FIG. 1 is a diagram showing one exemplary configuration of a testing apparatus 100 and an electronic device 200 according to one embodiment of the invention. The electronic device 200 is a device such as a semiconductor circuit and generates a phase-demodulated or frequency-demodulated signal-under-measurement. The signal-under-measurement may be a signal outputted out of the electronic device 200 to the outside or a signal transmitted within the electronic device 200 for example. The testing apparatus 100 judges whether or not the electronic device 200 is defect-free based on the signal-under-measurement.

The electronic device 200 has an operation circuit 210, a demodulator 230 and a package section 220. The operation circuit 210 is a circuit to be evaluated or tested and outputs an output signal based on the circuit operation. For example, the operation circuit 210 may be a PLL circuit that generates a clock signal or a logic or analog circuit that generates other signals.

The demodulator 230 receives the output signal from the operation circuit 210 and outputs a demodulation signal in which a phase-modulated or frequency-modulated component of the output signal has been demodulated as the signal-under-measurement. For example, the demodulator 230 samples a low frequency modulation component out of the output signal in which a high frequency carrier signal has been modulated by the low frequency modulation component.

The operation circuit 210 and the demodulator 230 are provided within the package section 220. The package section 220 is made of ceramics, resin or the like and insulates the operation circuit 210 and the demodulator 230 from the outside. The package section 220 has terminals for electrically connecting the inside and outside of the electronic device 200. For example, the package section 220 may have a terminal for outputting the output signal generated by the operation circuit 210 or a terminal for outputting the signal generated by the demodulator 230. The package section 220 may also have an output terminal common to the operation circuit 210 and the demodulator 230.

Such configuration allows the electronic device 200 to output the modulated component by the signal-under-measurement at low frequency. It thus allows the phase-modulated or frequency-modulated component to be measured accurately even when the signal-under-measurement is measured on the outside of the package section 220 because deterioration of the signal is small.

The testing apparatus 100 has a measuring section 110, a judging section 120 and a calibration apparatus 300. The measuring section 110 measures the modulated component based on the demodulation signal outputted out of the electronic device 200. The measuring section 110 may measure the modulated component by sampling the demodulation signal for example. The measuring section 110 may also calculate a quantity of jitter in the output signal outputted out of the operation circuit 210 based on the sampling result. At this time, the modulated component contained in the output signal corresponds to a jitter component.

The judging section 120 judges whether or not the electronic device 200 is defect-free based on the measured result of the measuring section 110. For example, the judging section 120 may judge whether or not the electronic device 200 is defect-free based on the quantity of jitter measured by the measuring section 110.

The calibration apparatus 300 performs calibration on the demodulator 230. The demodulator 230 has a gain corresponding to circuit characteristics between input and output thereof, so that the demodulation signal inputted to the testing apparatus 100 is what the modulated component contained in the output signal outputted out of the operation circuit 210 is multiplied with the gain of the demodulator 230. Therefore, the calibration apparatus 300 adjusts the gain of the demodulator 230 to a predetermined gain so that the measuring section 110 can accurately measure the modulated component.

The calibration apparatus 300 has a direct current (DC) component detecting section 310, a gain calculating section 320, a calibrating section 330 and a control section 340. The DC component detecting section 310 detects a DC component of the demodulation signal outputted out of the electronic device 200. For example, the DC component detecting section 310 may detect average voltage of the demodulation signal as the DC component of the demodulation signal. The DC component detecting section 310 may also receive the bifurcated demodulation signal to be inputted to the measuring section 110.

The gain calculating section 320 calculates the gain in the demodulator 230 based on the DC component detected by the DC component detecting section 310. The calibrating section 330 calibrates the demodulator 230 based on the gain calculated by the gain calculating section 320. This calibration may be made directly to the demodulator 230 or indirectly to the demodulator 230 by correcting a measured value measured by the testing apparatus 100 based on the gain.

The calibrating section 330 of this example calculates a correction value to be multiplied with the measured value of the demodulation signal based on the gain and sends it to the judging section 120. For example, the calibrating section 330 calculates an inverse number of the gain as the correction value. The judging section 120 reduces an influence of the gain in the demodulator 230 by correcting the measured value measured by the measuring section 110 based on the correction value.

Such process allows the modulated component outputted out of the operation circuit 210 to be accurately measured. It also allows the electronic device 200 to be accurately tested.

The control section 340 controls the electronic device 200 so as to output the demodulation signal. The electronic device 200 may be a circuit that outputs the output signal to the outside during when it is actually operated and that outputs the demodulation signal to the outside during when it is tested for example. In this case, the control section 340 causes the electronic device 200 to output the demodulation signal during its test.

Figure 2:
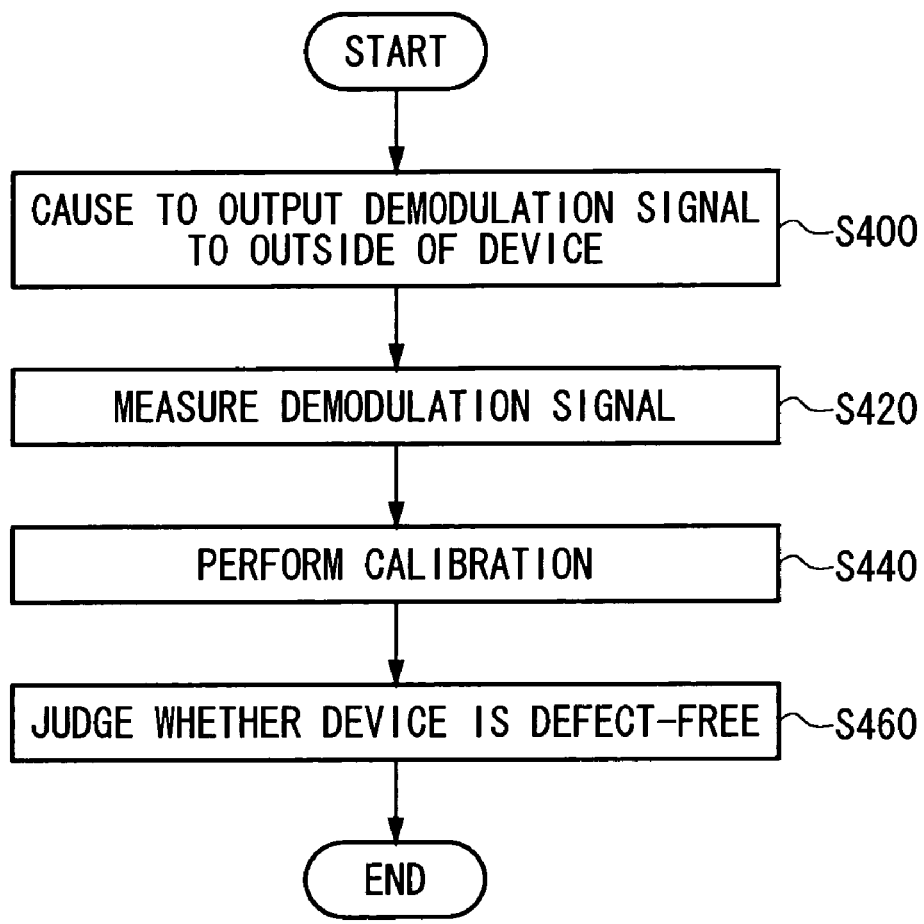
FIG. 2 is a flowchart showing one exemplary operation of the testing apparatus explained in FIG. 1.

FIG. 2 is a flowchart showing one exemplary operation of the testing apparatus 100 explained in FIG. 1. At first, the control section 340 causes the electronic device 200 to output the demodulation signal in an output control step S400. Next, the measuring section 110 measures the demodulation signal in a measuring step S420.

The calibration apparatus 300 calculates the gain in the demodulator 230 in a calibration step S440. Then, the calibration apparatus 300 calibrates the demodulator 230 based on the gain. In this example, the calibration apparatus 300 calculates the gain based on the DC component of the demodulation signal. The calibration apparatus 300 also sends the correction value based on the gain to the judging section 120.

Next, the judging section 120 judges whether or not the electronic device 200 is defect-free based on a quantity of jitter of the demodulation signal measured by the measuring section 110 in a judging step S460. For example, the judging section 120 may judge whether or not the electronic device 200 is defect-free by comparing the quantity of jitter measured by the measuring section 110 with a preset judgment value.

Figure 3:
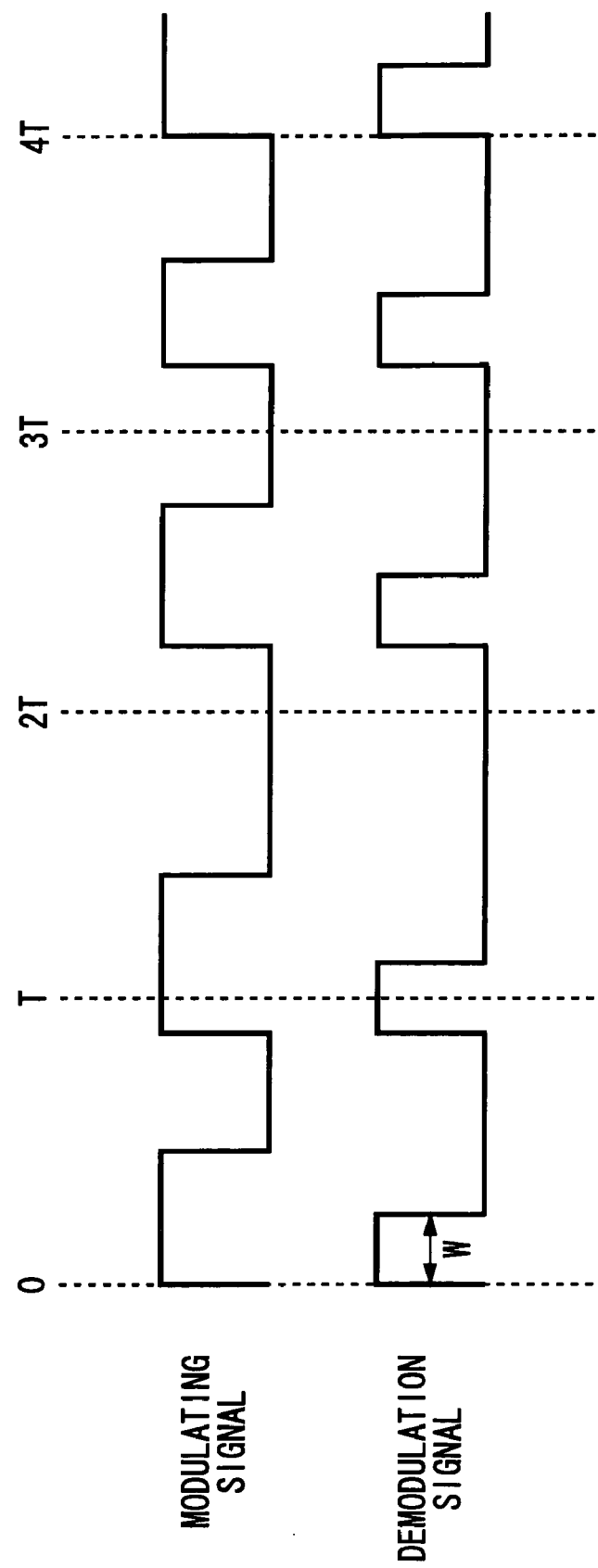
FIG. 3 is a chart showing one exemplary waveforms of an output signal inputted to a demodulator and a demodulation signal outputted out of the demodulator.

FIG. 3 is a chart showing one exemplary waveforms of the output signal inputted to the demodulator 230 and of the demodulation signal outputted out of the demodulator 230. As shown in FIG. 3, the output signal has pulses whose timing in each cycle is shifted from a carrier period (0, T, 2T, ...) due to frequency modulation or phase modulation. Still more, a pulse width of each pulse differs from each other.

The demodulator 230 outputs the demodulation signal by outputting pulses having a predetermined pulse width W corresponding to edges of the output signal. In this example, the demodulator 230 outputs the pulses per rising edge of the output signal. The demodulator 230 may have a pulse generator for generating the pulses. The pulse generator may be easily constructed by combining a delaying circuit and a logic circuit for example. Thus, the demodulator 230 generates the demodulation signal sampling the information (modulated components) at the edge position of the output signal.

Figure 4:
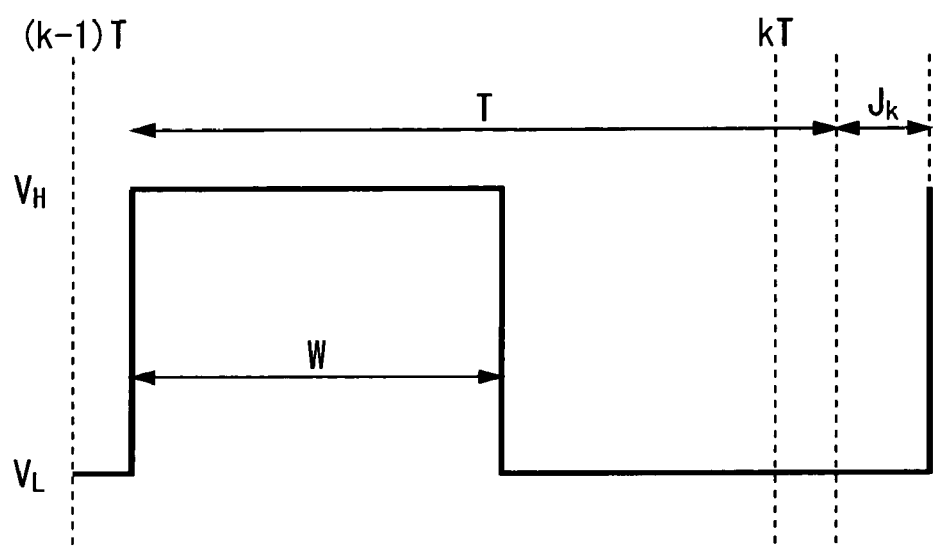
FIG. 4 is a chart showing one exemplary waveform of the demodulation signal of $k^{-th}$ period.

FIG. 4 is a chart showing one exemplary waveform of the demodulation signal of $k^{th}$ cycle. In the figure, VH represents a voltage value when the demodulation signal presents a logical value 1 and VL represents a voltage value when the demodulation signal presents a logical value 0. T represents an average period of the demodulation signal and Jk represents a cyclic quantity of jitter of the $k^{-th}$ cycle.

The average voltage of the demodulation signal of the k-th cycle may be given by the following equation:

$$\overline{Vk} = \frac{VH \cdot W + VL(T + Jk - W)}{T + Jk} \qquad \text{Eq. 1}$$
$$= VL + \frac{(VH - VL)W}{T} \cdot \frac{1}{1 + \frac{Jk}{T}}$$

When Jk/T=Jk', Equation 1 is reduced as follows:

$$\overline{Vk} = VL + \frac{(VH - VL)W}{T} \cdot \frac{1}{1 + Jk'} \qquad \text{Eq. 2}$$

When an absolute value of Jk' is 0.1 or less, it may be approximated within an error of 0.1%, as follows:

$$\frac{1}{1 + Jk'} \approx 1 - Jk' \qquad \text{Eq. 3}$$

Substituting Equation 3 into Equation 2 gives the following equation:

$$\overline{Vk} \approx -\frac{(VH - VL)W}{T}Jk' + \left[VL + \frac{(VH - VL)W}{T}\right] \qquad \text{Eq. 4}$$

Since the average voltage is proportional to the cyclic jitter Jk' as it is apparent from Equation 4, it is possible to measure the cyclic jitter by measuring the demodulation signal. Then, the measuring section 110 may measure the cyclic jitter by measuring the average voltage of the demodulation signal.

Still more, since timing jitter is equal to a value obtained by accumulating and adding the cyclic jitter, it is possible to obtain the timing jitter by integrating the cyclic jitters. The measuring section 110 may also measure the timing jitter of the demodulation signal based on the signal obtained by integrating the demodulation signal. At this time, it is preferable for the measuring section 110 to obtain a gain of an integrating circuit in advance. It then becomes possible to remove an influence of variation of the integrating circuit by dividing the timing jitter by the gain of the integrating circuit.

The gain G of the demodulator 230 may be given as a proportional coefficient of the average voltage and the cyclic jitter from Equation 4, as follows:

$$G = -\frac{(VH - VL)W}{T} \qquad \text{Eq. 5}$$

Here the pulse width W varies due to the process fluctuation, temperature and others, so that the value of the gain G also varies per electronic device 200. The calibration apparatus 300 calibrates this variation.

A second term on the right side of Equation 4 is a constant value because the pulse width W is constant. Meanwhile, a first term of the right side of Equation 4 is proportional to the cyclic jitter Jk' and its time mean value becomes zero. Accordingly, the second term of the right side of Equation 4 becomes the DC component VDC of the demodulation signal and Equation 4 is reduced as follows:

$$VDC = VL + \frac{(VH-VL)W}{T} = VL - G \qquad \text{Eq. 6}$$

The gain G of the demodulator 230 is calculated from Equation 6 as follows:

$$= VL - VDC \qquad \text{Eq. 7}$$

Accordingly, obtaining the voltage value VL when the demodulation signal presents the logical value 0 and the voltage value VDC of the DC component of the demodulation signal gives the gain G of the demodulator 230. Specifically, when VL=0 (GND), the gain G of the demodulator 230 may be obtained from the voltage value VDC of the DC component of the demodulation signal. The DC component detecting section 310 may measure the voltage values VL and VDC. When the voltage value VL is known, the DC component detecting section 310 may measure the voltage value VDC.

The gain calculating section 320 calculates the gain G as shown in Equation 7 based on the measured result of the DC component detecting section 310. The calibrating section 330 sends a correction coefficient based on the gain G to the judging section 120.

Because the cyclic jitter component (modulated component) of the demodulation signal is amplified by the gain G of the demodulator 230, the cyclic jitter of the output signal inputted to the demodulator 230 may be measured while eliminating the influences such as the process fluctuation of the demodulator 230 by dividing the measured value of the cyclic jitter of the measuring section 110 by the gain G.

The variation of the gain caused by the process fluctuation is not dependent on frequency of signal, so that the influence of the process fluctuation may be removed by calibrating based on the DC component. The calibrating section 330 may apply the correction value calculated based on the DC component to the entire frequency band.

The calibration may be carried out at any timing before starting the test or during a period from the start of the test to the judgment whether or not the electronic device 200 is defect-free. Still more, the calibration apparatus 300 may calculate the gain in parallel with the measurement of the quantity of jitter performed by the measuring section 110.

Figure 5:
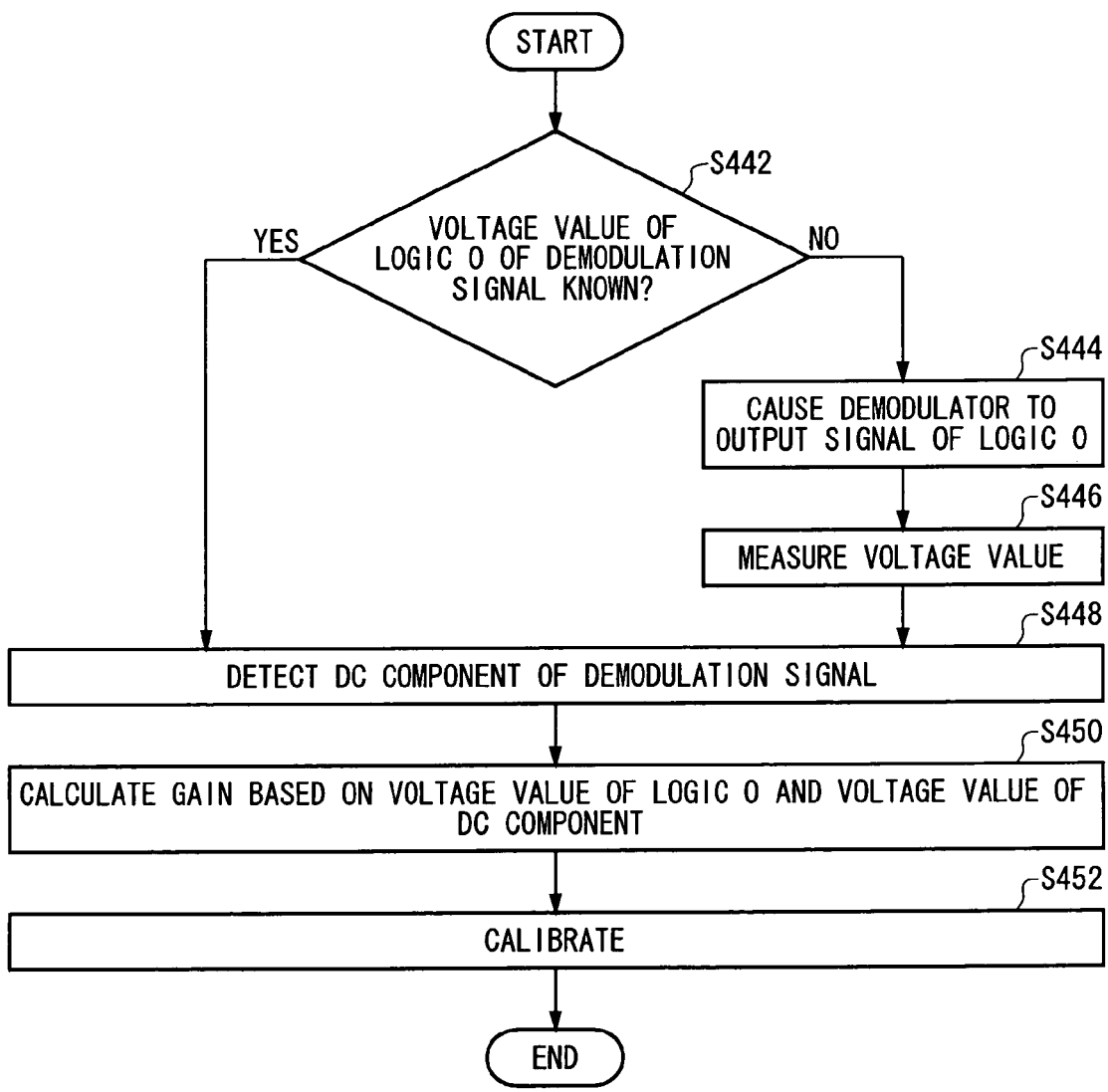
FIG. 5 is a flowchart showing one exemplary processes of a calibration step S440.

FIG. 5 is a flowchart showing one exemplary process of the calibration step S440. At first, the control section 340 of FIG. 1 judges whether or not the voltage value VL when the demodulation signal presents the logical value 0 is known in Step S442. When the VL is known, the process of Step S448 is carried out. When the VL is not known, the control section 340 of FIG. 1, causes the demodulator 230 of FIG. 1 to output a signal of the logical value 0 in Step S444. That is, the control section 340 of FIG. 1 causes the demodulator 230 of FIG. 1 to output a signal whose voltage value is fixed to VL.

Then, the DC component detecting section 310 measures the voltage value VL of the signal outputted out of the demodulator 230 in Step S446.

Next, the control section 340 causes the demodulator 230 to output the demodulation signal. Still more, the DC component detecting section 310 detects the DC component of the demodulation signal in Step S448. The DC component detecting section 310 may detect the average voltage of the demodulation signal as the DC component.

Next, the gain calculating section 320 calculates the gain G of the demodulator 230 based on the voltage value VL when the logical value is 0 and the voltage value VDC of the DC component in Step S450. Then the calibrating section 330 carries out the calibration based on the gain in Step S452.

Figure 6:
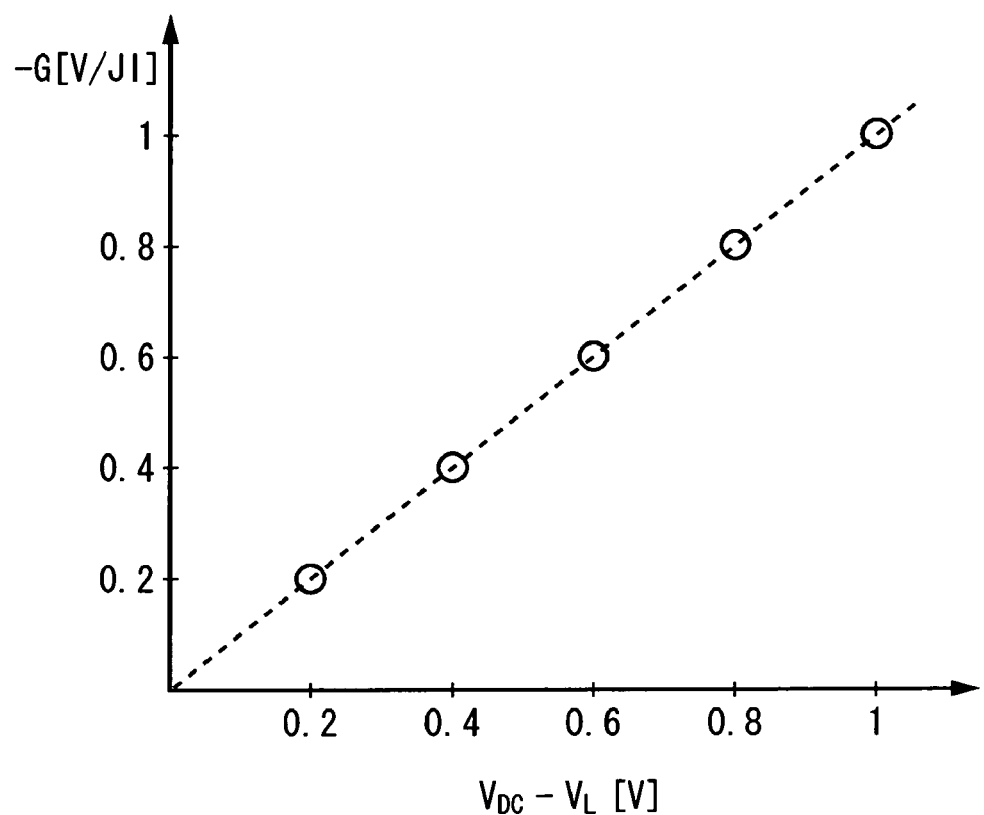
FIG. 6 is a graph showing a result when a gain G of the demodulator is obtained by simulation (Matlab) by using the demodulation signal outputted out of the demodulator and by changing a difference between VDC and VL when a clock to which cyclic jitter of sine wave is applied is inputted to the demodulator as an output signal.

FIG. 6 is a graph showing a result when the gain G of the demodulator 230 is obtained by simulation (Matlab) by using the demodulation signal outputted out of the demodulator 230 and by changing a difference between VDC and VL when a clock to which cyclic jitter of sine wave has been applied is inputted to the demodulator 230 as an output signal. In this example, the gain is plotted when the difference between VDC and VL is 0.2 V, 0.4 V, 0.6 V, 0.8 V and 1 V, respectively. As shown in FIG. 6, the gain is plotted on a straight line passing through the origin and coordinates (1, 1), so that it verifies that Equation 7 holds.

Figure 7:
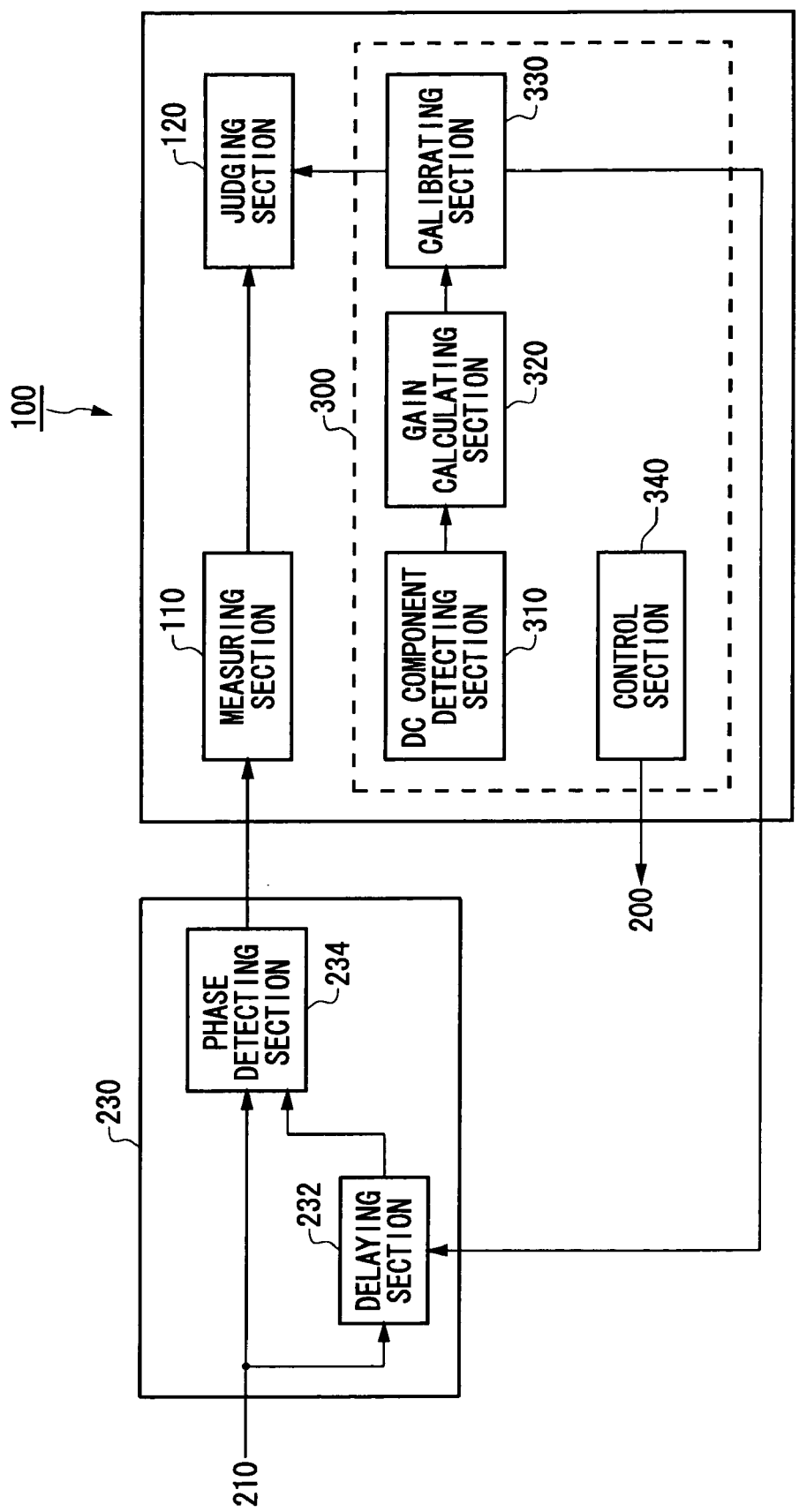
FIG. 7 is a diagram showing one exemplary configuration of the demodulator.

FIG. 7 is a diagram showing one exemplary configuration of the demodulator 230. The demodulator 230 of this example has a delaying section 232 and a phase detecting section 234. The delaying section 232 receives the output signal outputted out of the operation circuit 210 and generates a delay signal of the output signal delayed by a predetermined delay time. The delay time in the delaying section 232 is almost equal with the pulse width W described above.

The phase detecting section 234 receives the output signal outputted out of the operation circuit 210 and the delay signal outputted out of the delaying section 232 and generates the demodulation signal by outputting a pulse having a pulse width corresponding to a phase difference of the output signal and the delay signal. The phase detecting section 234 may be an exclusive OR circuit for example. Because this phase difference is almost equal with the delay time of the delaying section 232, so that the pulse width of the demodulation signal is almost equal with the delay time.

It is preferable to be able to control the delay time of the delaying section 232 from the outside. In this case, the calibration apparatus 300 may adjust the gain of the demodulator 230 by controlling the delay time of the delaying section 232. It is thus possible to adjust the gain of the demodulator 230 by adjusting the delay time of the delaying section 232, i.e., the pulse width W of the demodulation signal, as shown in Equation 5. The calibration apparatus 300 may adjust the delay time of the delaying section 232 so that the gain of the demodulator 230 becomes an optimal value (maximum value). It is also preferable for the measuring section 110 to measure the demodulation signal after the adjustment of the delay time performed by the calibration apparatus 300.

It is noted that the configuration of the demodulator 230 is not limited only to what shown in FIG. 7. For example, the demodulator 230 may further include a frequency divider for dividing the output signal and inputting it to the delaying section 232 and to the phase detecting section 234. The demodulator 230 may also include an inverter for judging the output of the delaying section 232. In this case, the phase detecting section 234 may be an AND circuit. Still more, the phase detecting section 234 may be a phase-frequency detector.

Figure 8:
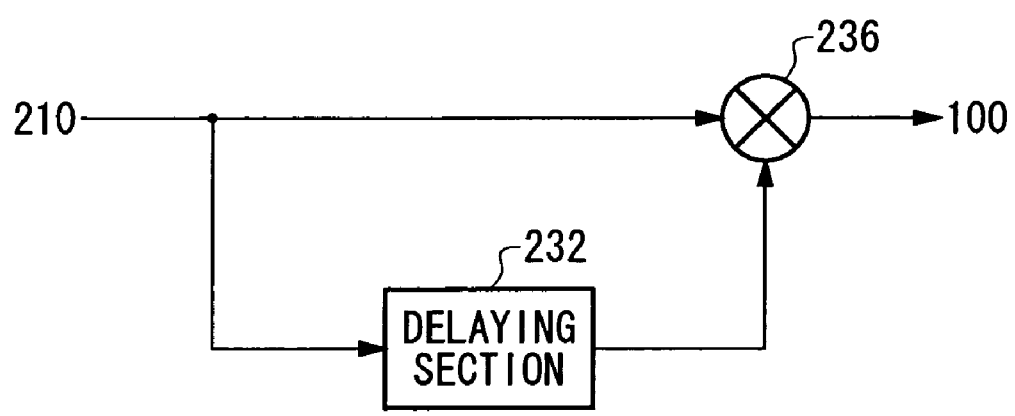
FIG. 8 is a diagram showing another exemplary configuration of the demodulator.

FIG. 8 is a diagram showing another exemplary configuration of the demodulator 230. The demodulator 230 of this example has the delaying section 232 and a mixer 236. The delaying section 232 receives the output signal outputted out of the operation circuit 210 and generates a delay signal of the output signal delayed by a predetermined delay time. For example, the delaying section 232 generates the delay signal of the output signal delayed by a quarter cycle. The mixer 236 multiplies the output signal with the delay signal to generate the demodulation signal.

For example, the phase-modulated output signal f(t) may be expressed as follows:

$$f(t) = \sin(\omega_0 t + \Delta\phi(t)) \quad \text{Eq. 8}$$

where ω0 represents angular frequency of a carrier component of the output signal and Δφ (t) represents a phase-modulated component.

In this case, the delay signal of the signal delayed by the quarter cycle may be expressed by the following equation:

$$g(t) = \sin\left(\omega_0\left(t - \frac{T}{4}\right) + \Delta\phi\left(t - \frac{T}{4}\right)\right) = \cos\left(\omega_0 t + \Delta\phi\left(t - \frac{T}{4}\right)\right) \quad \text{Eq. 9}$$

where T represents a period of the carrier component of the output signal.

Because the demodulation signal outputted out of the mixer 236 is a signal obtained by multiplying the signals represented by Equations 8 and 9, the demodulation signal v(t) may be expressed by the following equation:

$$v(t) = \frac{1}{2}\left\{\sin\left(2\omega_0 t + \Delta\phi(t) + \Delta\phi\left(t - \frac{T}{4}\right)\right) - \sin\left(\Delta\phi(t) - \Delta\phi\left(t - \frac{T}{4}\right)\right)\right\} \quad \text{Eq. 10}$$

Here, the demodulation signal v(t) is reduced as follows by removing a first term of the right side of Equation 10 by using a low-pass filter.

$$v(t) = -\frac{1}{2}\sin\left(\Delta\phi(t) - \Delta\phi\left(t - \frac{T}{4}\right)\right) \quad \text{Eq. 11}$$

Still more, if Δφ(t)−Δφ(t−T/4) is sufficiently small, Equation 11 may be approximated by the following equation:

$$v(t) \approx -\frac{1}{2}\left(\Delta\phi(t) - \Delta\phi\left(t - \frac{T}{4}\right)\right) \quad \text{Eq. 12}$$

As shown in Equation 12, variation of timing jitter per quarter cycle, i.e., the cyclic jitter, may be obtained from the output of the mixer 236. Accordingly, it is possible to demodulate the timing jitter of the output signal by adding this variation per quarter cycle. The demodulator 230 may further include the low-pass filter for removing the first term of the right side of Equation 10.

Still more, the calibrating section 330 may calculate the correction value based on the gain of the demodulator 230.

Figure 9:
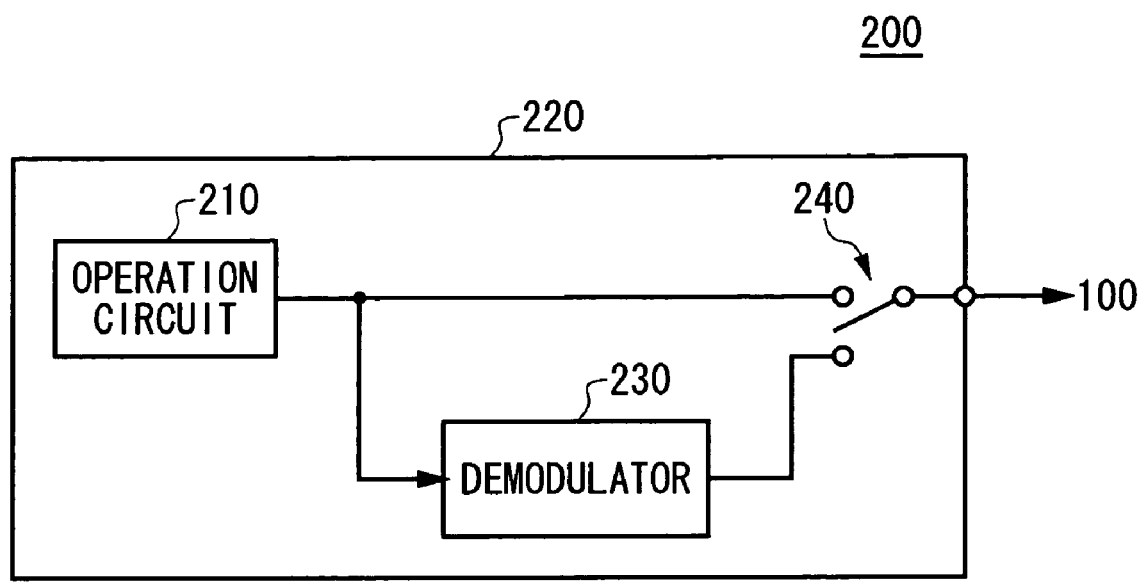
FIG. 9 is a diagram showing another exemplary configuration of the electronic device.

FIG. 9 is a diagram showing another exemplary configuration of the electronic device 200. The electronic device 200 of this example further includes an output section 240 in addition to the configuration of the electronic device 200 shown in FIG. 1. The other components may have the same function with those denoted by the same reference numerals in FIG. 1.

The outputting section 240 receives the output signal outputted out of the operation circuit 210 and the demodulation signal outputted out of the demodulator 230 and selects and outputs either one to the outside. For example, the outputting section 240 outputs the output signal to the outside when the electronic device 200 is actually operated and outputs the demodulation signal to the outside when the electronic device 200 is tested. Or, the outputting section 240 may output the output signal to the outside during normal time and may output the demodulation signal to the outside when it is instructed to output the demodulation signal from the outside.

Figure 10:
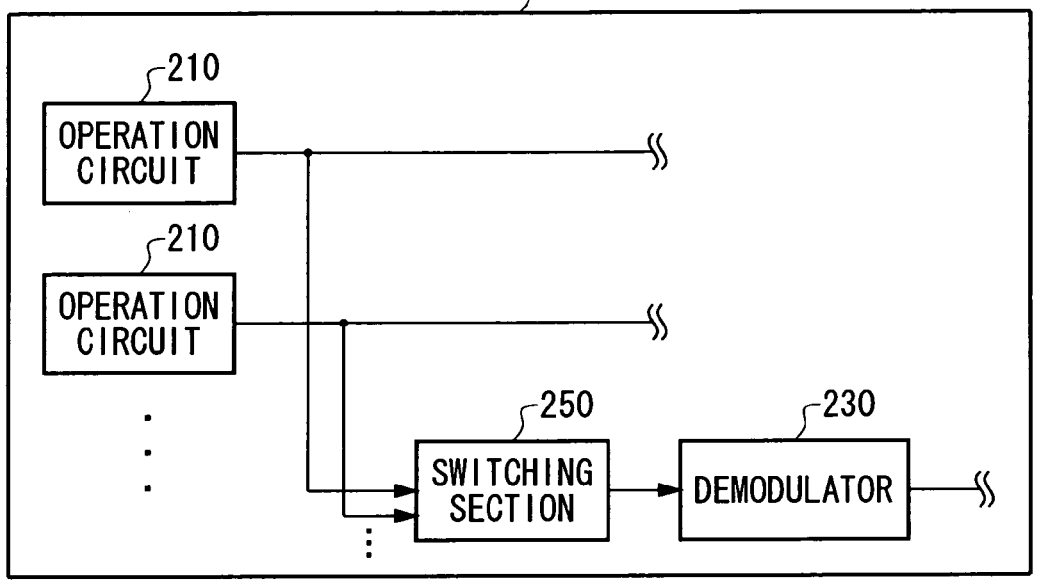
FIG. 10 is a diagram showing a still other exemplary configuration of the electronic device.

FIG. 10 is a diagram showing still another exemplary configuration of the electronic device 200. The electronic device 200 of this example has a plurality of operation circuits 210, a switching section 250 and the demodulator 230. The plurality of operation circuits 210 generates the output signals, respectively. The switching section 250 switches the output signal to be inputted to the demodulator 230 among the output signals outputted out of the plurality of operation circuits 210. For example, the switching section 250 may receive an instruction from the testing apparatus 100 specifying which operation circuit 210 is be tested and may select the output signal thereof corresponding to the instruction.

The demodulator 230 outputs the demodulation signal in which the inputted output signal has been demodulated. The demodulator 230 may output the demodulation signal to the outside via the outputting section 240 as shown in FIG. 9 or without going through the outputting section 240.

Figure 11:
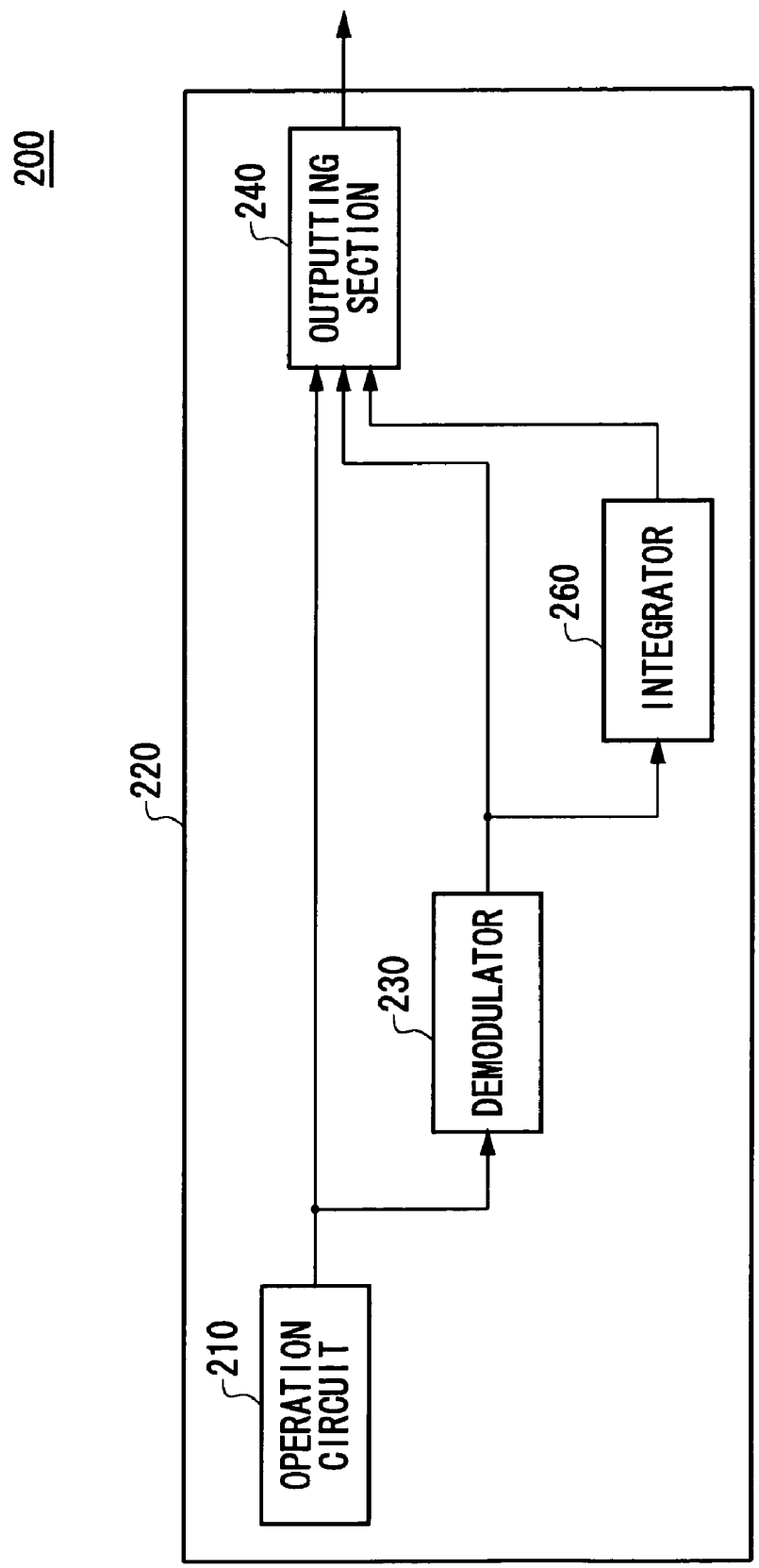
FIG. 11 is a diagram showing a still other exemplary configuration of the electronic device.

FIG. 11 is a diagram showing a still other exemplary configuration of the electronic device 200. The electronic device 200 of this example further includes an integrator 260 in addition to the configuration of the electronic device 200 shown in FIG. 9. The other components may have the same function with those denoted by the same reference numerals in FIG. 9.

The integrator 260 integrates the demodulation signal outputted out of the demodulator 230. The integrator 260 may be a capacitor that is charged with a predetermined charge current during when the demodulation signal presents the logical value 1 and that is discharged with a predetermined discharge current during when the demodulation signal presents the logical value 0 for example. It is possible to detect an integral value of the demodulation signal from the voltage value of the capacitor.

The outputting section 240 also selects either one of the output signal outputted out of the operation circuit 210, the demodulation signal outputted out of the demodulator 230 and the signal outputted out of the integrator 260 and outputs it to the outside. For example, the outputting section 240 may select the output signal during when the electronic device 200 is actually operated, may select the demodulation signal when the cyclic jitter of the output signal is measured and may select the output signal of the integrator 260 when the timing jitter of the output signal is measured.

It is preferable for the calibrating section 330 to be informed of a gain of the integrator 260 in advance. It is also preferable for the calibrating section 330 to calibrate based on the gain of the integrator 260 in addition to the measured gain of the demodulator 230 because the modulated component of the signal outputted out of the integrator 260 is amplified by the gains of the demodulator 230 and the integrator 260.

Figure 12:
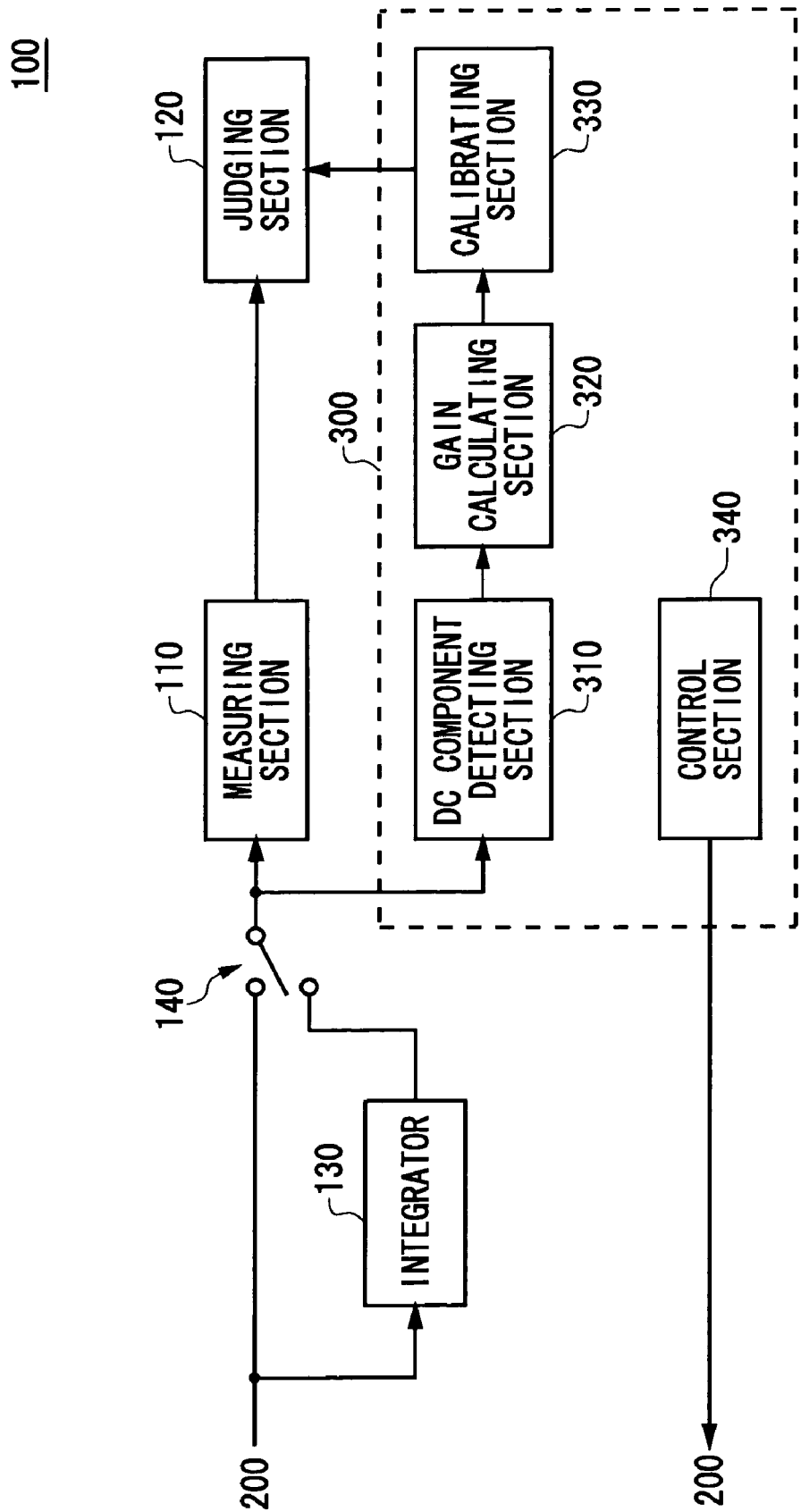
FIG. 12 is a diagram showing another exemplary configuration of the testing apparatus.

FIG. 12 is a diagram showing another exemplary configuration of the testing apparatus 100. The testing apparatus 100 of the present example further includes an integrator 130 and a switching section 140 in addition to the components of the testing apparatus 100 shown in FIG. 1. In this case, the electronic device 200 is not necessary to have the integrator 260 explained in FIG. 11.

The integrator 130 integrates the demodulation signal outputted out of the electronic device 200. The switching section 140 selects either the demodulation signal or the output signal of the integrator 130 and inputs it to the measuring section 110 and the DC component detecting section 310. For example, the switching section 140 may select the demodulation signal when the cyclic jitter of the output signal is measured and may select the output signal of the integrator 130 when the timing jitter of the output signal is measured. The switching section 140 may also select the demodulation signal when the gain of the demodulator 230 is measured.

Still more, it is preferable for the calibrating section 330 to be informed of the gain of the integrator 130 in advance.

As it is apparent from the above description, the invention allows the demodulated component and jitter component to be measured at low cost and quickly by providing the demodulator within the electronic device that generates the output signal.

Still more, the invention allows the measurement to be accurately carried out because it allows the calibration of the demodulator to be readily carried out based on the DC component.

What is claimed is:

1. A BIST (Built-In-Self-Test) electronic device, comprising:
    an operation circuit for outputting an output signal to be tested or evaluated;
    a demodulator having externally controllable gain, operative to receive said output signal from said operation circuit and output a demodulation signal representing a demodulated phase-modulated or frequency-modulated component of said output signal,
    wherein the operations circuit further comprises an output section for externally outputting an output signal when the said electronic device is actually operated, and externally outputting said demodulation signal when said electronic device is tested; and,
    the electronic device further comprises a package section for containing said operation circuit, said demodulator and said output section therein, wherein said electronic device outputs said output signal and said demodulation signal from said package section.

2. The electronic device as set forth in claim 1, wherein said demodulation signal comprises pulses having a predetermined pulse width, the leading edges of which correspond in time to leading edges of pulses of said output signal.

3. The electronic device as set forth in claim 2, wherein said demodulator comprises:
    a delaying section for generating a delay signal corresponding to said output signal delayed by a delay time corresponding to said predetermined pulse width; and
    a phase detecting section for outputting pulses having a pulse width corresponding to a phase difference between said output signal and said delay signal.

4. The electronic device as set forth in claim 1, wherein said demodulator comprises:
    a delaying section for generating a delay signal corresponding to said output signal which has been delayed by a predetermined delay time; and
    a mixer for generating said demodulation signal by multiplying said output signal with said delay signal.

5. The electronic device as set forth in claim 1, further comprising an integrator for integrating said demodulation signal output from said demodulator.

6. The electronic device as set forth in claim 5, further comprising an output section for selecting either said demodulation signal output from said demodulator or the signal output from said integrator and outputting it from said electronic device.

7. The electronic device as set forth in claim 1, further comprising:
    a plurality of operation circuits that generate a plurality of output signals, respectively; and
    a switching section for selecting a particular output signal of said plurality of operation circuits to be input to said demodulator.

8. The electronic device as set forth in claim 1, further comprising a delay circuit for varying a delay and changing the gain of said demodulator according to the delay.

9. A testing apparatus for testing an electronic device, the electronic device having an operation circuit for outputting an output signal to be tested or evaluated and a demodulator, having externally controllable gain, for receiving said output signal from said operation circuit and outputting a demodulation signal representing a demodulated phase-modulated or frequency-modulated component of said output signal, said testing apparatus comprising:
    a gain calculating section for calculating the demodulator gain;
    a measuring section for measuring said frequency-modulated component based on said demodulation signal, said measuring section measuring said frequency-modulated component based on said demodulation signal and the gain of said demodulator; and
    a judging section for judging whether or not said electronic device is operating according to a predetermined standard based on said modulated component.

10. The testing apparatus as set forth in claim 9, further comprising an integrator for integrating said demodulation signal, wherein
    said measuring section measures said phase-modulated component at least in part based on an output of said integrator, and
    said judging section judges whether or not said electronic device is operating according to predetermined criteria based on said phase-modulated component.

11. A testing method for testing an electronic device, having an operation circuit for outputting an output signal to be tested or evaluated and an externally gain controllable demodulator for receiving said output signal from said operation circuit and outputting a demodulation signal representing a demodulated phase-modulated or frequency-modulated component of said output signal is demodulated, said testing method comprising:
    measuring said frequency-modulated component based on said demodulation signal;
    judging whether or not said electronic device is defect-free based on said frequency-modulated component;
    calculating the gain of said demodulator; and
    measuring said phase-modulated component based on said demodulation signal and the gain of said demodulator.

12. The testing method as set forth in claim 11, further comprising integrating said demodulation signal, wherein
    said measuring said modulated component is further based on an output of said integration; and
    said judging is further based on said modulated component.

* * * * *